United States Patent
Iwai

(10) Patent No.: US 7,880,504 B2
(45) Date of Patent: Feb. 1, 2011

(54) LOGIC STAGES WITH INVERSION TIMING CONTROL

(75) Inventor: Hitoshi Iwai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/563,389

(22) Filed: Sep. 21, 2009

(65) Prior Publication Data
US 2010/0231258 A1    Sep. 16, 2010

(30) Foreign Application Priority Data
Mar. 13, 2009   (JP) .............................. 2009-060890

(51) Int. Cl.
*H03K 19/096* (2006.01)
*H03K 17/28* (2006.01)
(52) U.S. Cl. .............................. 326/93; 326/98; 327/392
(58) Field of Classification Search .................. 326/93, 326/95, 98; 327/392, 398–401
See application file for complete search history.

(56) References Cited

U.S. PATENT DOCUMENTS 6,320,421 B1 * 11/2001 Akita et al. ................. 326/113
6,583,655 B2 * 6/2003 Takahashi et al. ............ 327/160
6,646,474 B2 * 11/2003 Forbes .......................... 326/98

FOREIGN PATENT DOCUMENTS

JP    2006-211494    8/2006

OTHER PUBLICATIONS

Rakesh Vattikonda, et al., "Modeling and Minimization of PMOS NBTI Effect for Robust Nanometer Design", Design Automation Conference, 43$^{rd}$ ACM/IEEE, 2006, pp. 1047-1052.

* cited by examiner

*Primary Examiner*—James Cho
(74) *Attorney, Agent, or Firm*—Oblon, Spivak, McClelland, Maier & Neustadt, L.L.P.

(57) ABSTRACT

A semiconductor integrated circuit includes logic circuits connected in a plurality of stages, a voltage-level inverting unit that is inserted in a signal transmission path of the logic circuits and inverts a voltage level input to the logic circuits, and an inversion-timing control unit that controls inversion timing for the voltage level inverted by the voltage-level inverting unit.

10 Claims, 6 Drawing Sheets

US 7,880,504 B2

LOGIC STAGES WITH INVERSION TIMING CONTROL

CROSS-REFERENCE TO RELATED APPLICATIONS

This application is based upon and claims the benefit of priority from the prior Japanese Patent Application No. 2009-060890, filed on Mar. 13, 2009; the entire contents of which are incorporated herein by reference.

BACKGROUND OF THE INVENTION

1. Field of the Invention

The present invention relates to a semiconductor integrated circuit, and, more particularly is suitably applied to a method of suppressing a pulse waveform, which is transmitted sequentially via logic circuits including field effect transistors, from deteriorating because of negative bias temperature instability (NBTI) or positive bias temperature instability (PBTI).

2. Description of the Related Art

It is known that a P-channel metal-oxide semiconductor (PMOS) transistor deteriorates with time because of NBTI. The aged deterioration due to NBTI is a phenomenon in which, when an ON state of the PMOS transistor continues for a long time under a high-temperature condition (e.g., when source voltage and drain voltage are 0 volt and gate voltage is negative bias), threshold voltage of the PMOS transistor rises and a current driving ability falls.

Japanese Patent Application Laid-Open No. 2006-211494 discloses a method of alternately switching, every time an enable signal EN changes to a low level, a logic level of a buffer and a flip-flop to a low-level fixed state and a high-level fixed state to thereby allow the high-level fixed period and the low-level fixed period to be regarded the same, equalizing the influence of delayed deterioration due to NBTI of the buffer, and suppressing a clock skew.

However, in the method disclosed in Japanese Patent Application Laid-Open No. 2006-211494, it is necessary to alternately switch the logic level of the buffer and the flip-flop to the low-level fixed state and the high-level fixed state even in a non-transmission period of a signal. This causes an increase in a consumed current and a circuit area.

BRIEF SUMMARY OF THE INVENTION

A semiconductor integrated circuit according to an embodiment of the present invention comprises: logic circuits connected in a plurality of stages; a voltage-level inverting unit that is inserted in a signal transmission path of the logic circuits and inverts a voltage level input to the logic circuits; and an inversion-timing control unit that controls inversion timing for the voltage level inverted by the voltage-level inverting unit.

A semiconductor integrated circuit according to an embodiment of the present invention comprises: a first inverter group in which a plurality of inverters are connected in a plurality of stages; a second inverter group that is connected to a post stage of the first inverter group and in which a plurality of inverters are connected in a plurality of stages; and a voltage-level inverting unit that is inserted between the first inverter group and the second inverter group and inverts, in a non-transmission period of a signal transmitted sequentially via the inverters, a voltage level input from the first inverter group to the second inverter group.

A semiconductor integrated circuit according to an embodiment of the present invention comprises: a first shift register group in which a plurality of shift registers that shift data in synchronization with a clock signal are connected in a plurality of stages; a second shift register group that is connected to a post stage of the first shift register group and in which a plurality of shift registers that shift data in synchronization with the clock signal are connected in a plurality of stages; a first inverter group that is provided in the first shift register group and transmits the clock signal sequentially via a plurality of inverters; a second inverter group that is provided in the second shift register group and transmits the clock signal sequentially via a plurality of inverters; and a voltage-level inverting unit that is inserted between the first inverter group and the second inverter group and inverts, in a non-transmission period of the clock signal, a voltage level input from the first inverter group to the second inverter group.

DETAILED DESCRIPTION OF THE INVENTION

Exemplary embodiments of the present invention are explained in detail below with reference to the accompanying drawings. The present invention is not limited by the embodiments.

Figure 1:
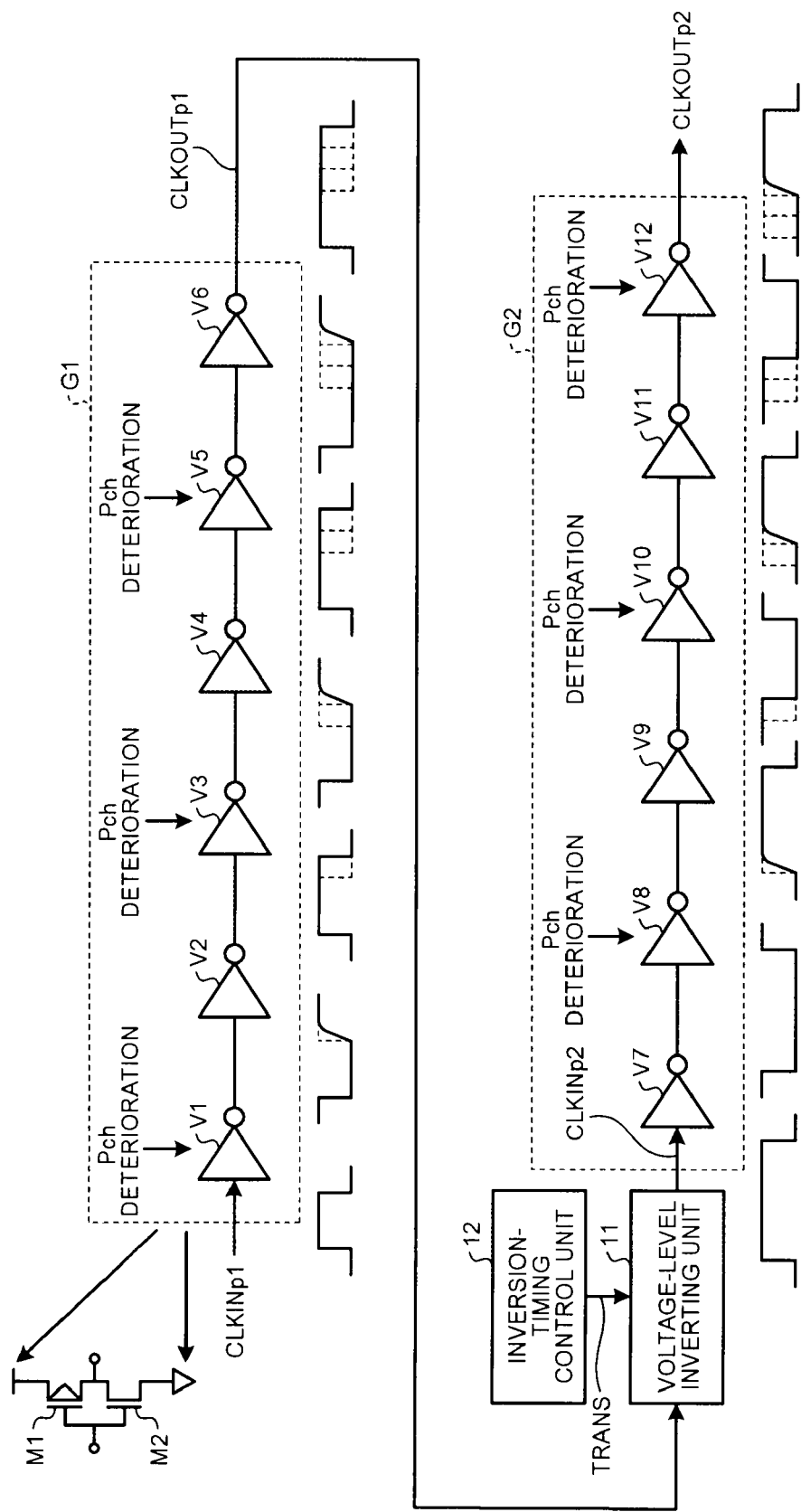
FIG. 1 is a block diagram of a schematic configuration of a semiconductor integrated circuit according to a first embodiment of the present invention and transmission waveforms of the semiconductor integrated circuit.

FIG. 1 is a block diagram of a schematic configuration of a semiconductor integrated circuit according to a first embodiment of the present invention and transmission waveforms of the semiconductor integrated circuit.

In FIG. 1, the semiconductor integrated circuit includes inverters V1 to V12, a voltage-level inverting unit 11, and an inversion-timing control unit 12. The inverters V1 to V12 are connected in a plurality of stages. The inverters V1 to V12 include P-channel field effect transistors (hereinafter, "Pch transistors") M1 and N-channel field effect transistors (hereinafter, "Nch transistors") M2. Gates of the Pch transistors M1 and gates of the Nch transistors M2 are connected in common. Drains of the Pch transistors M1 and drains of the Nch transistors M2 are connected in common. Sources of the Pch transistors M1 are fixed at a high level (e.g., power supply potential). Sources of the Nch transistors M2 are fixed at a low level (e.g., ground potential).

The voltage-level inverting unit 11 is inserted on a signal transmission path of the inverters V1 to V12. For example, the inverters V1 to V6 are included in an inverter group G1. The inverters V7 to V12 are included in an inverter group G2. The voltage-level inverting unit 11 is inserted between the inverter groups G1 and G2.

The voltage-level inverting unit 11 inverts a voltage level input to the inverter group G2. The inversion-timing control unit 12 controls inversion timing for the voltage level inverted by the voltage-level inverting unit 11. It is preferable that the inversion-timing control unit 12 controls, in a non-transmission period of a signal transmitted sequentially via the inverters V1 to V12, the inversion timing such that the voltage level input to the inverter group G2 is inverted.

Figure 2:
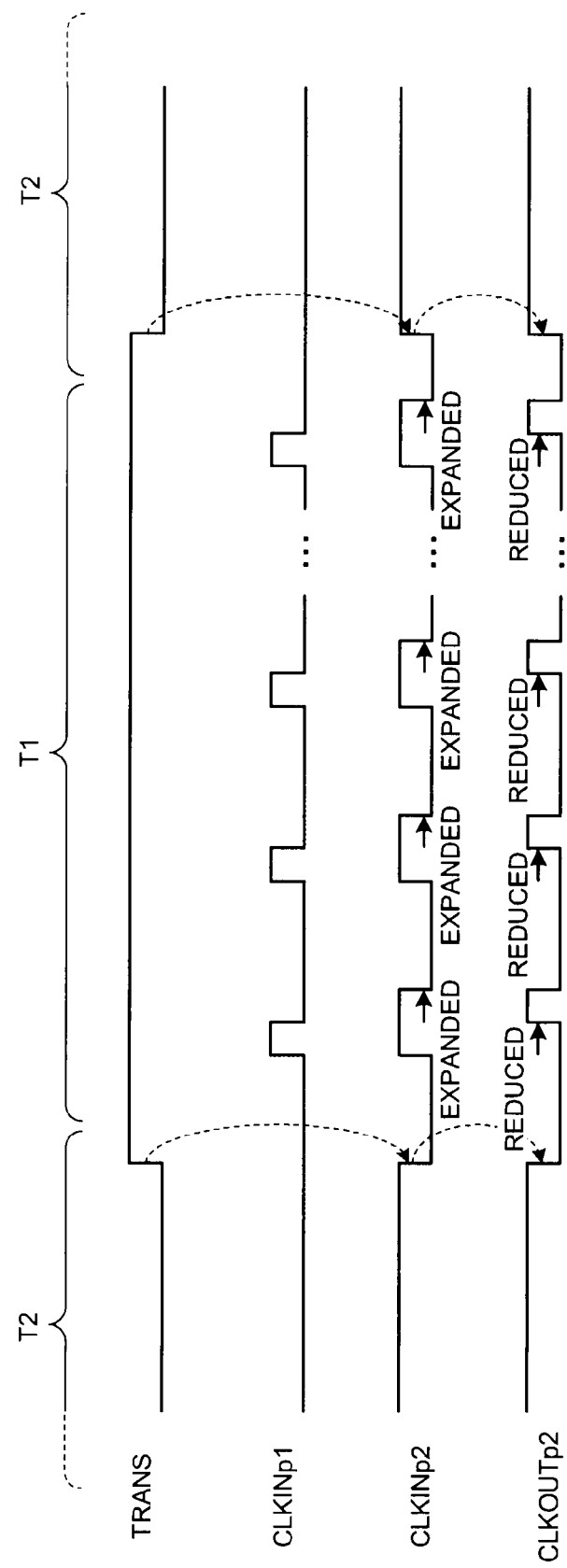
FIG. 2 is a timing chart of waveforms of units of the semiconductor integrated circuit shown in FIG. 1.

FIG. 2 is a timing chart of waveforms of the units of the semiconductor integrated circuit shown in FIG. 1. T1 indicates a transmission period of the signal transmitted sequentially via the inverters V1 to V12 shown in FIG. 1. T2 indicates a non-transmission period of the signal transmitted sequentially via the inverters V1 to V12 shown in FIG. 1.

In FIG. 2, it is assumed that, in the non-transmission period T2, an input signal CLKINp1 input to the inverter V1 is fixed at the low level. It is assumed that, when an inversion timing control signal TRANS is at the low level, a voltage level output from the inverter group G1 is inverted by the voltage-level inverting unit 11 and then output to the inverter group G2. It is assumed that, when the inversion timing control signal TRANS is at the high level, the voltage level output from the inverter group G1 is output to the inverter group G2 without being inverted by the voltage-level inverting unit 11.

In the non-transmission period T2, when the input signal CLKINp1 is fixed at the low level, the input signal CLKINp1 is sequentially inverted by the inverters V1 to V6 and an output signal CLKOUTp1 from the inverter group G1 also changes to the low level. The output signal CLKOUTp1 from the inverter group G1 is inverted by the voltage-level inverting unit 11 and then input to the inverter group G2. An input signal CLKINp2 of the inverter group G2 is fixed at the high level. When the input signal CLKINp2 is fixed at the high level, the input signal CLKINp2 is sequentially inverted by the inverters V7 to V12 and an output signal CLKOUTp2 from the inverter group G2 also changes to the high level.

As a result, in the inverter group G1, the Pch transistors M1 of the inverters V1, V3, and V5 in odd number stages are turned on and the Pch transistors M1 of the inverters V2, V4, and V6 in even number stages are turned off. Aged deterioration due to NBTI of the Pch transistors M1 is worsened when the Pch transistors M1 are turned on. Therefore, aged deterioration due to NBTI of the Pch transistors M1 of the inverters V1, V3, and V5 in the odd number stages conspicuously appears.

On the other hand, in the inverter group G2, when the input signal CLKINp2 is fixed at the high level, the Pch transistors M1 of the inverters V7, V9, and V11 in odd number stages are turned off and the Pch transistors M1 of the inverters V8, V10, and V12 in even number stages are turned on. Therefore, aged deterioration due to NBTI of the Pch transistors M1 of the inverters V8, V10, and V12 in the even number stages more conspicuously appears than aged deterioration due to NBTI of the Pch transistors M1 of the inverters V7, V9, and V11 in the odd number stages.

It is assumed that, in the inverter group G1, aged deterioration due to NBTI occurs in the Pch transistors M1 of the inverters V1, V3, and V5 in the odd number stages and, in the inverter group G2, aged deterioration due to NBTI occurs in the Pch transistors M1 of the inverters V8, V10, and V12 in the even number stages.

In the transmission period T1, driving input for driving from the low level to the high level by the Pch transistors M1 falls. Therefore, a rising edge of a signal dulls every time the signal passes the inverters V1, V3, and V5 in the odd number stages. On the other hand, driving input for driving from the high level to the low level by the Pch transistors M1 does not fall. Therefore, a falling edge of the signal does not dull even if the signal passes the inverters V2, V4, and V6 in the even number stages.

As a result, as the signal passes the inverters V1 to V6, the width of the high level of the signal is expanded. The width of the high level of the output signal CLKOUTp1 increases to be wide compared with the width of the high level of the input signal CLKINp1.

In the transmission period T1, the output signal CLKOUTp1 is input to the inverter group G2 without the level's being inverted in voltage level inverting unit 11.

In the inverter group G2, driving input for driving from the high level to the low level by the Pch transistors M1 falls. Therefore, a rising edge of a signal dulls every time the signal passes the inverters V8, V10, and V12 in the even number stages. On the other hand, driving input for driving from the high level to the low level by the Pch transistors M1 does not fall. Therefore, a falling edge of the signal does not dull even if the signal passes the inverters V7, V9, and V11 in the odd number stages.

As a result, as the signal passes the inverters V7 to V12, the width of the high level of the signal is reduced. The width of the high level of the output signal CLKOUTp2 decreases to be narrow compared with the width of the high level of the input signal CLKINp2.

Consequently, the width of the high level of the signal expanded by the inverter group G1 can be narrowed by the inverter group G2. Therefore, it is possible to compensate for deterioration due to NBTI of a pulse waveform transmitted sequentially via the inverters V1 to V12 without alternately switching the signal to a low-level fixed state and a high-level fixed state in the non-transmission period T2 of the signal. It is possible to improve reliability of the semiconductor integrated circuit while suppressing an increase in a consumed current and a circuit area.

In the embodiment, the twelve inverters V1 to V12 connected in a plurality of stages to compensate for deterioration due to NBTI are explained as an example. However, the number of inverters is not limited to twelve. The number can be an arbitrary number as long as a plurality of inverters are provided. As a method of grouping the inverters V1 to V12 connected in a plurality of stages into the inverter groups G1 and G2, a method of grouping the inverters V1 to V12 into groups of six inverters is explained. However, the inverters V1 to V12 can be allocated to the inverter groups G1 and G2 in arbitrary numbers as long as a plurality of inverters are included in the inverter groups G1 and G2, respectively. In the embodiment, a method of grouping the inverters V1 to V12 into the two inverter groups G1 and G2 is explained. However, the inverters V1 to V12 can be grouped into an arbitrary number of groups as long as a plurality of inverters are included in respective inverter groups.

In the first embodiment, the inverters V1 to V12 connected in a plurality of stages to compensate for deterioration due to NBTI are explained as an example. However, any logic circuits can be adopted as long as a pulse waveform is transmitted sequentially via Pch transistors. For example, the logic circuits can be NOT circuits, AND circuits, OR circuits, NAND circuits, or NOR circuits or these circuits can be mixed. A transmitted signal does not always need to be a clock. Deterioration due to NBTI is explained as an example in this embodiment. However, this embodiment can also be applied when positive bias temperature instability (PBTI) is conspicuous.

Figure 3:
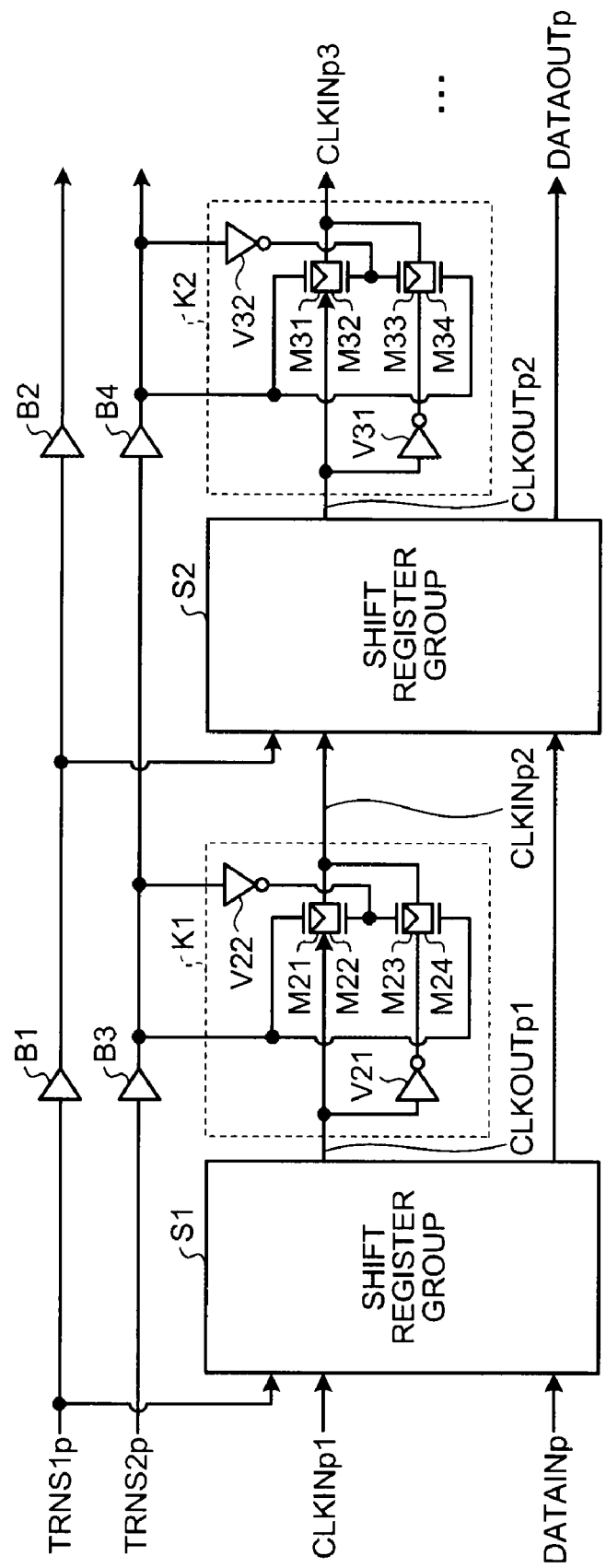
FIG. 3 is a block diagram of a schematic configuration of a semiconductor integrated circuit according to a second embodiment of the present invention.

FIG. 3 is a block diagram of a schematic configuration of a semiconductor integrated circuit according to a second embodiment of the present invention.

In FIG. 3, the semiconductor integrated circuit includes shift register groups S1 and S2 and voltage-level inverting units K1 and K2. The shift register group S2 is connected to a post stage of the shift register group S1. The voltage-level inverting units K1 and K2 are respectively inserted on clock signal output sides of the shift register groups S1 and S2. The semiconductor integrated circuit also includes buffers B1 and B2 that transmit a mis-transfer prevention signal TRANS1$p$ and buffers B3 and B4 that transmit an inversion timing control signal TRNS2$p$.

In a non-transmission period of a clock signal input to the shift register groups S1 and S2, the voltage-level inverting units K1 and K2 invert a voltage level input to a shift register group in the next stage. Specifically, the voltage-level inverting unit K1 includes Pch transistors M21 and M23, Nch transistors M22 and M24, and inverters V21 and V22.

An output side of the buffer B3 is connected to gates of the Nch transistors M22 and M24 and the Pch transistors M21 and M23 via the inverter V22. A clock signal output side of the shift register group S1 is connected to drains of the Pch transistor M21 and the Nch transistor M22. A clock signal output side of the shift register group S1 is connected to drains of the Pch transistor M23 and the Nch transistor M24 via the inverter V22. Sources of the Pch transistors M21 and M23 and the Nch transistors M22 and M24 are connected to a clock signal input side of the shift register group S2.

The voltage-level inverting unit K2 includes Pch transistors M31 and M33, Nch transistors M32 and M34, and inverters V31 and V32.

An output side of the buffer B4 is connected to gates of the Nch transistor M32 and the Pch transistor M33 via the inverter V32. The output side of the buffer B4 is also connected to gates of the Nch transistor M34 and the Pch transistor M31. A clock signal output side of the shift register group S2 is connected to drains of the Pch transistor M31 and the Nch transistor M32. The clock signal output side of the shift register group S2 is also connected to drains of the Pch transistor M33 and the Nch transistor M34 via the inverter V32. Sources of the Pch transistors M31 and M33 and the Nch transistors M32 and M34 are connected to a clock signal input side of a shift register group in the next stage of the shift register group S2.

Figure 4:
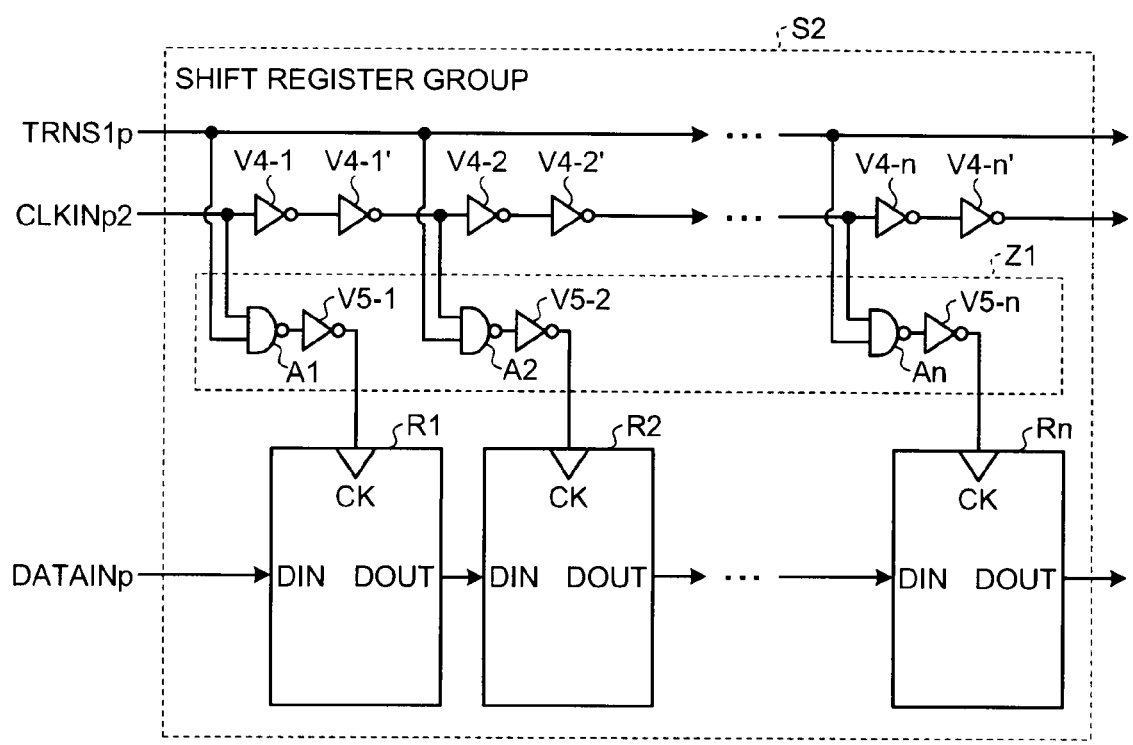
FIG. 4 is a block diagram of a schematic configuration of a shift register group S2 of the semiconductor integrated circuit shown in FIG. 3.

FIG. 4 is a block diagram of a schematic configuration of the shift register group S2 of the semiconductor integrated circuit shown in FIG. 3.

In FIG. 4, the shift register group S2 includes shift registers R1 to Rn, inverters V4-1 to V4-$n$ and V4-1' to V4-$n$', and a mis-transfer preventing circuit Z1. n is an integer equal to or larger than 2. The shift registers R1 to Rn are serially connected. The inverters V4-1 to V4-$n$ and V4-1' to V4-$n$' are serially connected. The inverters V4-1 to V4-$n$ and V4-1' to V4-$n$' transmit the clock signal CLKINp2 input to the shift register group S2 to the shift registers R1 to Rn.

The mis-transfer preventing circuit Z1 prevents a voltage level inverted by the voltage-level inverting unit K1 shown in FIG. 3 from being transferred to a clock terminal of the shift register group S2. Specifically, the mis-transfer preventing circuit Z1 includes NAND circuits A1 to An and inverters V5-1 to V5-$n$. One input terminals of the NAND circuits A1 to An are respectively connected to input terminals of the inverters V4-1 to V4-$n$. The other input terminals of the NAND circuits A1 to An are connected to a transmission line for a mis-transfer prevention signal TRNS1$p$. Output terminals of the NAND circuits A1 to An are respectively connected to clock terminals CK of the shift registers R1 to Rn via the inverters V5-1 to V5-$n$.

The shift register group S1 can adopt a configuration same as that of the shift register group S2.

Figure 5:
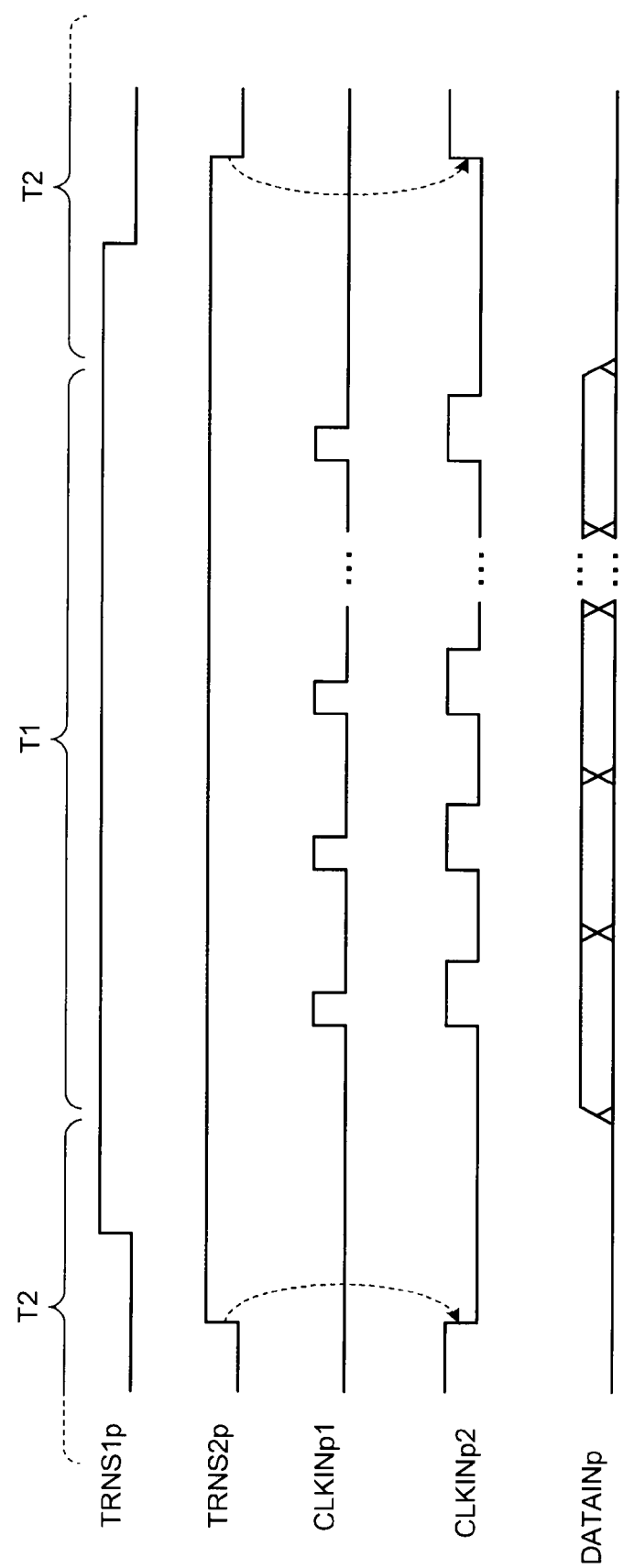
FIG. 5 is a timing chart of waveforms of units of the semiconductor integrated circuit shown in FIG. 3.

FIG. 5 is a timing chart of waveforms of the units of the semiconductor integrated circuit shown in FIG. 3.

In FIG. 5, it is assumed that, in the non-transmission period T2, the clock signal CLKINp1 input to the shift register group S1 is fixed at the low level. The clock signal CLKOUTp1 output from the shift register group S1 also changes to the low level. In the non-transmission period T2, when the inversion timing control signal TRNS2$p$ is at the low level, the Pch transistor M23 and the Nch transistor M24 are turned on. The clock signal CLKOUTp1 is input to the shift register group S2 via the inverter V21. The clock signal CLKINp2 input to the shift register group S2 is at the high level.

As a result, in the shift register group S1, Pch transistors of the inverters V4-1 to V4-$n$ in odd number stages are turned on and Pch transistors of the inverters V4-1' to V4-$n$' in even number stages are turned off. On the other hand, in the shift register group S2, the Pch transistors of the inverters V4-1 to V4-$n$ in the odd number stages are turned off and the Pch transistors of the inverters V4-1' to V4-$n$' in the even number stages are turned on. Therefore, in the shift register group S1, aged deterioration due to NBTI of the Pch transistors in the odd number stages of the inverters V4-1 to V4-$n$ conspicuously appears. In the shift register group S2, aged deterioration due to NBTI of the Pch transistors in the even number stages of the inverters V4-1' to V4-$n$' conspicuously appears.

In the non-transmission period T2, when the inversion timing control signal TRNS2$p$ is at the low level, the mis-transfer prevention signal TRNS1$p$ is also set at the low level. When the mis-transfer prevention signal TRNS1$p$ is at the low level, a level change of the clock signal CLKINp2 is prohibited from being input to the shift register group S2 in the NAND circuits A1 to An shown in FIG. 4. Mis-transfer by the shift register group S2 is prevented.

In the non-transmission period T2, when the inversion timing control signal TRNS2$p$ changes from the low level to the high level immediately before shifting to the transmission period T1, the Pch transistor M21 and the Nch transistor M22 are turned on. As a result, the clock signal CLKOUTp1 is input to the shift register group S2.

In the non-transmission period T2, after the inversion timing control signal TRNS2$p$ changes from the low level to the high level, when the mis-transfer prevention signal TRNS1$p$ also changes from the low level to the high level, a level change of the clock signal CLKINp2 is allowed to be input to the shift register group S2 in the NAND circuits A1 to An.

In the transmission period T1, when the clock signal CLKINp1 is input to the shift register group S1, data DATAINp input to the shift register group S1 is shifted via the shift registers R1 to Rn of the shift register group S1 every time the clock signal CLKINp1 rises.

In the transmission period T1, when the clock signal CLKINp2 is input to the shift register group S2, the data DATAINp input to the shift register group S2 is shifted via the shift registers R1 to Rn of the shift register group S2 every time the clock signal CLKINp2 rises.

Figure 6:
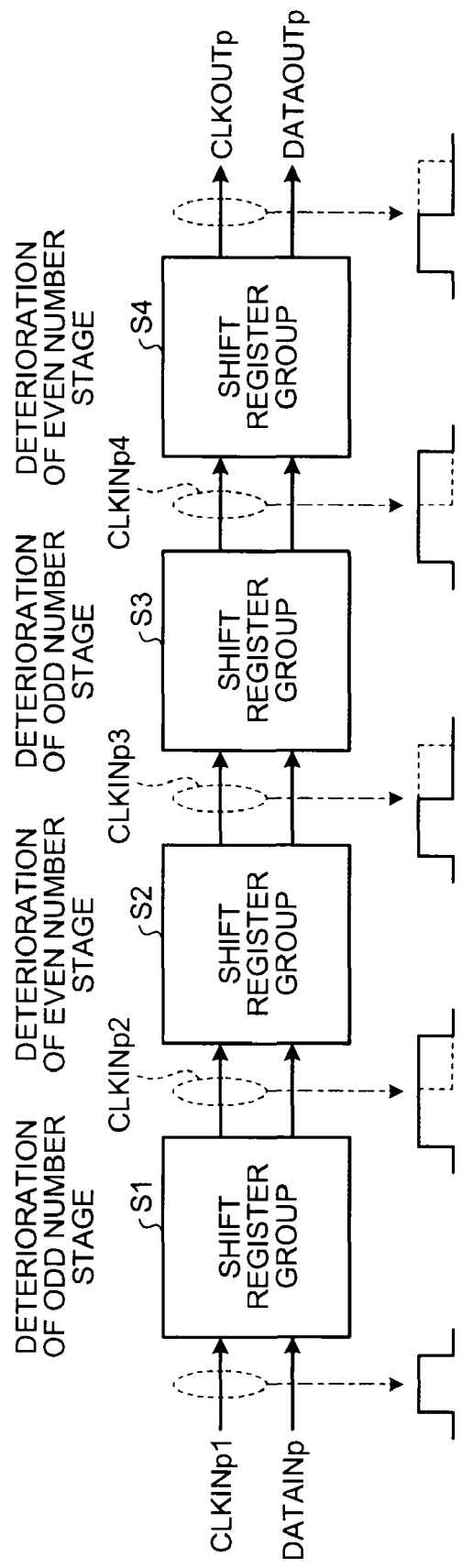
FIG. 6 is a diagram of transmission waveforms of shift register groups of the semiconductor integrated circuit shown in FIG. 3.

FIG. 6 is a diagram of transmission waveforms of shift register groups of the semiconductor integrated circuit shown in FIG. 3.

In FIG. 6, it is assumed that the shift register group S2 is connected to a post stage of the shift register group S1, the shift register group S3 is connected to a post stage of the shift register group S2, and the shift register group S4 is connected to a post stage of the shift register group S3. The shift register groups S1 to S4 can adopt a configuration same as that shown in FIG. 4.

It is assumed that, in the shift register groups S1 and S3, aged deterioration due to NBTI of the Pch transistors in odd number stages of the inverters V4-1 to V4-$n$ conspicuously appears and, in the shift register groups S2 and S4, aged deterioration due to NBTI of the Pch transistors in even number stages of the inverters V4-1' to V4-$n$' conspicuously appears.

When it is assumed that, in the transmission period T1, clock signals CLKINp1 to CLKINp4 are respectively input to the shift register groups S1 to S4, the width of the high level of the clock signals CLKINp1 and CLKINp3 is expanded by the shift register groups S1 and S3 and the width of the high level of the clock signals CLKINp2 and CLKINp4 is narrow by the shift register groups S2 and S4.

As a result, the width of the high level of the clock signals CLKINp1 and CLKINp3 expanded by the shift register groups S1 and S3 can be narrowed by the shift register groups S2 and S4. Therefore, it is possible to compensate for deterioration due to NBTI of a pulse waveform transmitted sequentially via the shift register groups S1 to S4 without alternately switching the clock signals CLKINp1 to CLKINp4 to the low-level fixed state and the high-level fixed state in the non-transmission period T2 of the clock signals CLKINp1 to CLKINp4. It is possible to improve reliability of the semiconductor integrated circuit while suppressing an increase in a consumed current and a circuit area.

In the second embodiment, the shift register groups S1 to S4 connected in a plurality of stages to compensate for deterioration due to NBTI are explained as an example. However, besides the shift register groups S1 to S4, the present invention can be applied to a row decoder and a column decoder used in a DRAM, a SRAM, a flash memory, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   logic circuits connected in a plurality of stages;
   a voltage-level inverting unit that is inserted in a signal transmission path of the logic circuits and inverts a voltage level input to the logic circuits; and
   an inversion-timing control unit that controls inversion timing for the voltage level inverted by the voltage-level inverting unit, wherein
   the inversion-timing control unit controls the inversion timing such that the voltage level is inverted in a non-transmission period of a signal transmitted sequentially via the logic circuits.

2. The semiconductor integrated circuit according to claim 1, wherein the logic circuits are configured such that a pulse waveform is transmitted sequentially via P-channel field effect transistors.

3. The semiconductor integrated circuit according to claim 2, wherein the logic circuits are grouped into a section in which pulse width of the pulse waveform is expanded and a section in which the pulse width of the pulse waveform is reduced.

4. A semiconductor integrated circuit comprising:
   a first inverter group in which a plurality of inverters are connected in a plurality of stages;
   a second inverter group that is connected to a post stage of the first inverter group and in which a plurality of inverters are connected in a plurality of stages; and
   a voltage-level inverting unit that is inserted between the first inverter group and the second inverter group and inverts, in a non-transmission period of a signal transmitted sequentially via the inverters, a voltage level input from the first inverter group to the second inverter group.

5. The semiconductor integrated circuit according to claim 4, wherein a signal input to the first inverter group and the second inverter group is transmitted while being sequentially inverted by the inverters in a transmission period of the signal.

6. The semiconductor integrated circuit according to claim 5, wherein, in the first inverter group, P-channel field effect transistors of the inverters in odd number stages are turned on and P-channel field effect transistors of the inverters in even number stages are turned off and, in the second inverter group, P-channel field effect transistors of the inverters in odd number stages are turned off and P-channel field effect transistors of the inverters in even number stages are turned on.

7. A semiconductor integrated circuit comprising:
   a first shift register group in which a plurality of shift registers that shift data in synchronization with a clock signal are connected in a plurality of stages;
   a second shift register group that is connected to a post stage of the first shift register group and in which a plurality of shift registers that shift data in synchronization with the clock signal are connected in a plurality of stages;
   a first inverter group that is provided in the first shift register group and transmits the clock signal sequentially via a plurality of inverters;
   a second inverter group that is provided in the second shift register group and transmits the clock signal sequentially via a plurality of inverters; and
   a voltage-level inverting unit that is inserted between the first inverter group and the second inverter group and inverts, in a non-transmission period of the clock signal, a voltage level input from the first inverter group to the second inverter group.

8. The semiconductor integrated circuit according to claim 7, wherein the voltage-level inverting unit inverts, in the non-transmission period of the clock signal, a voltage level input from the first inverter group to the second inverter group and does not invert, in a transmission period of the clock signal, the voltage level input from the first inverter group to the second inverter group.

9. The semiconductor integrated circuit according to claim 8, further comprising a mis-transfer preventing circuit that prevents the voltage level inverted by the voltage-level inverting unit from being transferred to clock terminals of the first shift register group and the second shift register group.

10. The semiconductor integrated circuit according to claim 9, wherein the mis-transfer preventing circuit prohibits, when the voltage level is inverted by the voltage-level inverting unit, the clock signal from being input to the shift register and allows, when the voltage level is not inverted by the voltage-level inverting unit, the clock signal to be input to the shift register.

* * * * *